US005552708A

United States Patent [19]
Ham

[11] Patent Number: 5,552,708
[45] Date of Patent: Sep. 3, 1996

[54] MAGNETIC RESONANCE IMAGING APPARATUS COMPRISING A COMMUNICATION SYSTEM

[75] Inventor: Cornelis L. G. Ham, Eindhoven, Netherlands

[73] Assignee: U.S. Philips Corporation, New York, N.Y.

[21] Appl. No.: 347,012

[22] Filed: Nov. 30, 1994

[30] Foreign Application Priority Data

Nov. 30, 1993 [BE] Belgium .............................. 09301319

[51] Int. Cl.[6] .................................................... G01R 33/28
[52] U.S. Cl. ........................................ 324/318; 128/653.5
[58] Field of Search .................................... 324/318, 324, 324/300; 128/653.2, 653.5; 381/74, 94

[56] References Cited

U.S. PATENT DOCUMENTS

| | | | |
|---|---|---|---|
| 4,689,565 | 8/1987 | Kemner | 324/309 |
| 4,696,030 | 9/1987 | Egozi | 381/94 |
| 4,723,294 | 2/1988 | Taguchi | 381/94 |
| 5,033,082 | 7/1991 | Eriksson et al. | 379/410 |
| 5,277,184 | 1/1994 | Messana | 324/318 |
| 5,293,578 | 3/1994 | Nagami et al. | 381/71 |
| 5,377,275 | 12/1994 | Suzuki | 381/71 |
| 5,384,537 | 1/1995 | Ito et al. | 324/318 |
| 5,398,286 | 3/1995 | Balestri et al. | 381/94 |
| 5,427,102 | 6/1995 | Shimode et al. | 324/318 |
| 5,436,564 | 7/1995 | Kreger et al. | 324/322 |

FOREIGN PATENT DOCUMENTS

| | | |
|---|---|---|
| 60-58734 | 4/1985 | Japan . |
| 1145051 | 6/1989 | Japan . |
| 2265790 | 10/1993 | United Kingdom . |
| 9002513 | 3/1990 | WIPO . |

*Primary Examiner*—Sandra L. O'Shea
*Assistant Examiner*—Raymond Y. Mah
*Attorney, Agent, or Firm*—Jack D. Slobod

[57] ABSTRACT

Magnetic resonance imaging includes a system of gradient coils (3) for generating gradient fields in a measuring space (35), a power supply source (7) for the gradient coils, and a communication system for transferring acoustic information from at least a first region (39) in which the level of gradient noise generated by the gradient coils (3) is comparatively high to at least a second region (41). The communication system includes a reference signal generating device for generating a reference signal which is dependent on the gradient noise, a microphone (43) which is arranged in the first region (39) so as to pick up a mixture of sound information and gradient noise, and a sound reproduction device (65, 67), at least a part of which is situated in the second region (41). The communication system also includes a noise suppression device, formed by a filter device (61) for converting the reference signal into a signal which corresponds substantially to the gradient noise at the area of the microphone (43), and a summing device (63) for adding the output signal of the filter device to the output signal of the microphone in phase opposition, the output of the summing device being connected to the sound reproduction device. Between the microphone (43) and the summing device (63) a signal delay device (53) is inserted which delays the microphone signal for a predetermined period of time. The sound reproduction device (65, 67) is provided with a device (69) for attenuating sound which does not originate from the sound reproduction device.

10 Claims, 2 Drawing Sheets

MAGNETIC RESONANCE IMAGING APPARATUS COMPRISING A COMMUNICATION SYSTEM

BACKGROUND OF THE INVENTION

1. Field of the Invention

The invention relates to a magnetic resonance imaging apparatus, comprising a magnet system for generating a steady magnetic field in a measuring space, a gradient coil system for generating gradient fields in the measuring space, a power supply source for the gradient coils, and a communication system for transferring acoustic information from at least a first region in which the level of sounds generated by the gradient coils referred to herein as "gradient noise" is comparatively high to at least a second region, which communication system comprises means for generating a reference signal which is dependent on the gradient noise, a microphone which is arranged in the first region so as to pick up a mixture of sound information and gradient noise, a sound reproduction device, at least a part of which is situated in the second region, and a noise suppression device which comprises a filter device for converting the reference signal into a signal which corresponds substantially to the gradient noise at the area of the microphone, and a summing device for adding the output signal of the filter device to the output signal of the microphone in phase opposition, the output of the summing device being connected to the sound reproduction device.

2. Description of the Related Art

U.S. Pat. No. 5,033,082 discloses a communication system with active noise cancellation which is suitable for various applications, one of the feasible applications mentioned being an application in a magnetic resonance imaging apparatus. As is known, during operation the gradient coils in such an apparatus produce an annoying noise which strongly impedes the communication between a patient being examined in the apparatus and personnel around the apparatus. The known communication system is capable of improving this situation, but it has been found that the result still is not optimum. For example, when the gradient coils are activated in a non-periodic manner (for example, in the case of quickly changing preparatory gradients, a non-linear profile sequence, changing slice orientations), the noise cancellation device cannot follow the noise signals caused by the gradient coils, so that the noise cancellation is either lacking or very incomplete. Moreover, in the second region disturbing noise may occur which is not compensated by the known device and which, in conformity with the cited document, requires a separate noise cancellation device which renders the overall device substantially more complex and expensive.

It is an object of the invention to provide a magnetic resonance imaging apparatus of the kind set forth in which the communication system is simpler and more effective than the known system. To this end, the device in accordance with the invention is characterized in that between the microphone and the summing device there are provided signal delay means for delaying the microphone signal for a predetermined period of time, and that the sound reproduction device comprises means for attenuating sound which does not originate from the sound reproduction device.

The invention is based on the idea that substantially complete suppression of (usually non-periodic) gradient noise is possible only if the reference signal is added to the output signal of the microphone exactly at the correct instant (with the correct phase and amplitude). The reference signal in the known device will generally be slightly too late so as to enable full compensation. Because the microphone signal is also delayed in accordance with the invention, the reference signal can arrive exactly on time again. Thus, the sound reproduction device reproduces the sound information substantially without noise. Should disturbing noise also occur in the second region, caused by the gradient coils or by other sources of noise, therefore, it suffices to ensure that this noise cannot reach the ear of the listener. This is very simply realised by providing means in accordance with the invention which attenuate sound which does not originate from the sound reproduction device.

A preferred embodiment of the apparatus in accordance with the invention is characterized in that the sound reproduction device comprises a headset with a pair of earphones which are embedded in a sound-absorbing material. This embodiment offers the advantage that the attenuation of the ambient sound is achieved by means of very simple steps and that the person wearing the headset has a given freedom of movement. This is the case notably when the headset is of the wireless type.

Most types of headset are connected to an amplifier via electrically conductive wires. Because it generally is undesirable for electrical conductors to extend into the measuring space from the outside, an embodiment of the apparatus in which the second region is at least partly coincident with the measuring space is characterized in that the sound reproduction device comprises an electro-acoustic transducer which is arranged outside the measuring space and which is acoustically connected, via at least an air-filled tubular connecting member, to sound reproduction members which are enclosed by a sound-absorbing material and form part of a head section which can be arranged on the head of a patient in the measuring space. In this embodiment the advantages of the use of a headset are obtained without incurring the drawbacks of electric conductors extending into the measuring space.

A further embodiment is characterized in that the means for generating the reference signal are arranged to receive on their input a signal which corresponds to the output signal of the power supply source for the gradient coils. This embodiment utilizes the idea that the signals presented to the gradient coils are directly related to the gradient noise produced by these coils. Thus, these signals contain advance knowledge concerning the gradient noise so that they are particularly suitable to act as the basis for forming the reference signal. Should for some reason this advance knowledge not be used, the reference signal can also be obtained in a different manner, for example in that the means for generating the reference signal comprise a second microphone which is arranged so that it can pick up the gradient noise.

BRIEF DESCRIPTION OF THE DRAWING

These and other aspects of the invention will be described in detail hereinafter with reference to the drawing wherein.

DETAILED DESCRIPTION OF THE PREFERRED EMBODIMENTS

Figure 1:
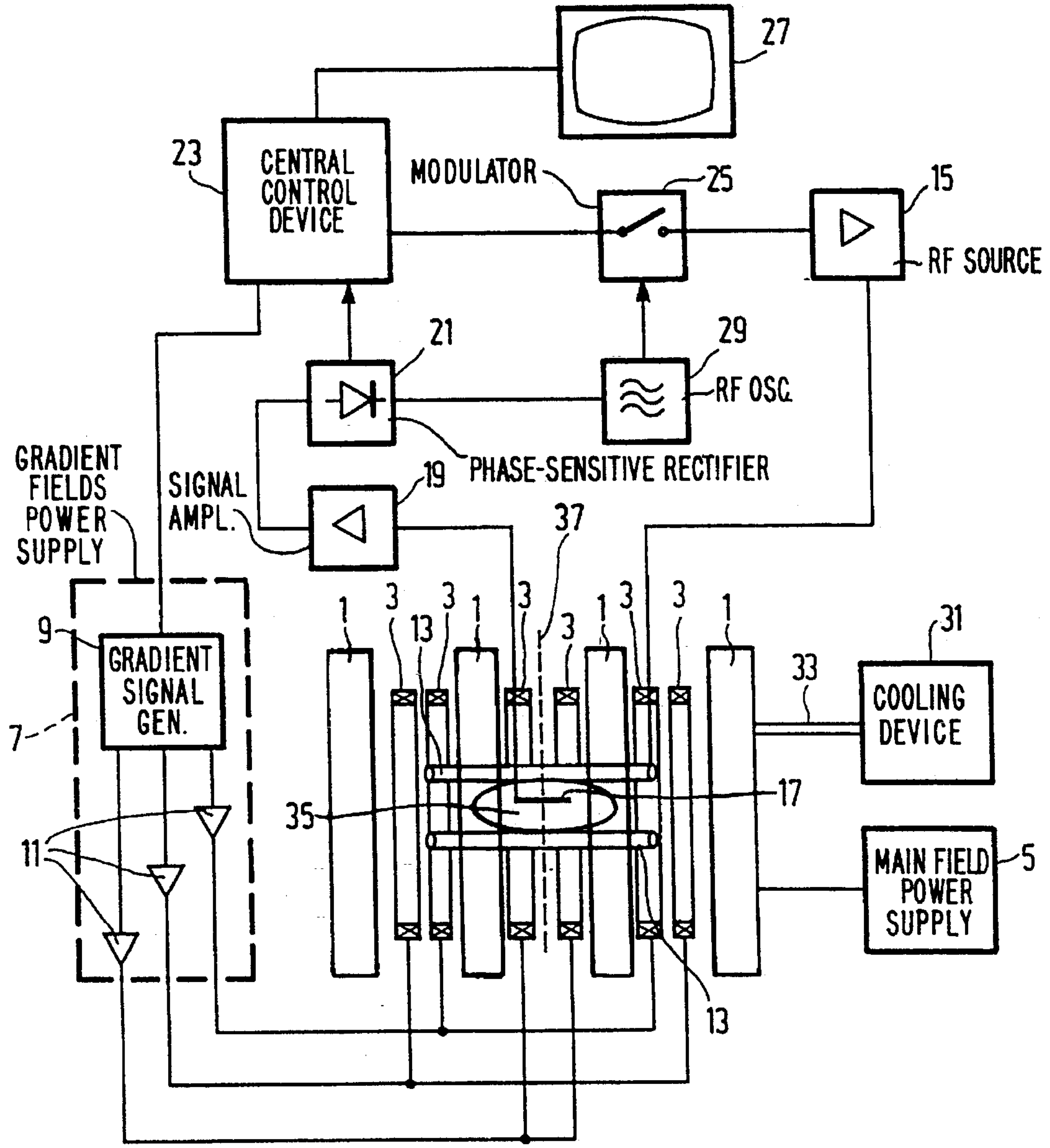
FIG. 1 shows diagrammatically an embodiment of a magnetic resonance imaging apparatus in which the invention can be used.

A magnetic resonance imaging apparatus as shown in FIG. 1 comprises a magnet system 1 for generating a steady, uniform main magnetic field, a gradient coil system 3 for generating magnetic gradient fields, and power supply sources 5 and 7 for the magnet system 1 and the gradient coil system 3, respectively. The power supply source 7 for the gradient coil system 3 comprises a gradient signal generator 9 and a number of gradient amplifiers 11, i.e. three in the present embodiment. A magnet coil 13, intended to generate an RF magnetic alternating field, is connected to an RF source 15. A surface coil 17 is shown for the detection of magnetic resonance signals generated by the RF transmitted field in an object to be examined. For the purpose of reading out the coil 17 is connected to a signal amplifier 19. The signal amplifier 19 is connected to a phase-sensitive rectifier 21 which itself is connected to a central control device 23. The central control device 23 also controls a modulator 25 for the RF source 15, the gradient signal generator 9 and a monitor 27 for display. An RF oscillator 29 controls the modulator 25 as well as the phase-sensitive rectifier 21 which processes the measuring signals. For cooling, if any, there is provided a cooling device 31 which comprises cooling ducts 33. A cooling device of this kind may be constructed as a water cooling system for resistive coils or as a liquid helium or nitrogen dewar system for cooled superconducting coils. The transmitter coil 13, arranged within the magnet systems 1 and 3, generates an RF field in a measuring space 35 which, in the case of a medical diagnostic apparatus, offers sufficient space to accommodate patients. Thus, a steady magnetic field, gradient fields for position selection of slices to be imaged, and a spatially uniform RF alternating field can be generated in the measuring space 35. The gradient coil system 3 is usually symmetrical relative to a radial symmetry plane 37 which thus also symmetrically subdivides the measuring space 35 into two parts and which is directed through the point Z=0, transversely of the Z axis (not shown) of the steady magnet system 1. The steady magnetic field generated by the steady magnet system 1, therefore, is directed along the Z axis in this case. A gradient coil system 3 in a magnetic resonance imaging apparatus customarily comprises a coil system for each of the coordinate directions X, Y and Z, activation of said coil systems enabling the generating of gradient fields in each of said directions so that a pixel-wise image of an object can be formed. The coil systems for the X gradient and the Y gradient are usually substantially the same, but rotated through 90° relative to one another in an azimuthal sense. Each of the three coil systems for the X, Y and Z gradients is connected, via one of the three gradient amplifiers 11, to a separate output of the gradient signal generator 9 which is arranged to generate a suitable signal for each of the three coil systems. Because the gradient coils 3 are situated in the magnetic field generated by the magnet system 1, flow of current through these coils causes forces which are capable of putting into motion the electric conductors constituting these coils and the carders on which they are mounted. The gradient coils thus act as loudspeaker coils and produce an annoying noise. Because the currents through the gradient coils are very large and the steady magnetic field is very strong, the noise level may become very high in given circumstances, for example more than 100 dBA. This noise is very annoying to the patient being examined by means of the apparatus as well as to the attending physician and the other staff working in the immediate vicinity of the apparatus and makes conversations between these persons very difficult.

Figure 2:
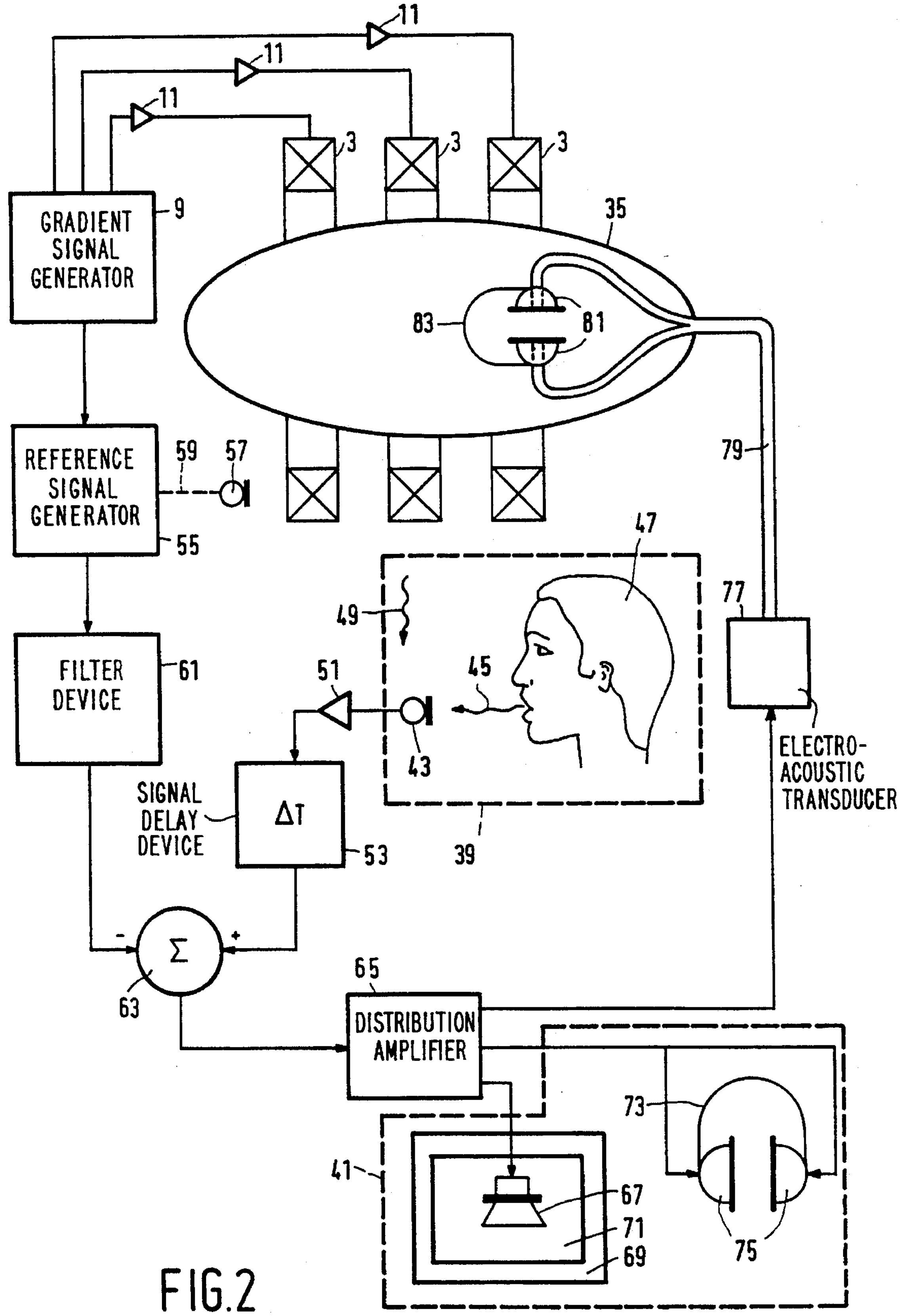
FIG. 2 shows a block diagram of the most important pans of an embodiment of the apparatus in accordance with the invention.

FIG. 2 shows a block diagram of an embodiment of a communication system which can be used in the apparatus shown in FIG. 1 in order to improve the communication between the persons present in and near the apparatus. The communication system serves to transfer acoustic information (for example, speech) from a first region 39 to a second region 41. The first region 39 is situated in the direct vicinity of the gradient coils 3 where the level of the sounds generated by these coils (gradient noise) is comparatively high, for example in the vicinity of the magnet system 1 or in the measuring space 35. The second region 41 may also be situated in the vicinity of the magnet system 1 or in the measuring space 35 or at a larger distance from the magnet system 1. Evidently, there may also be more first and second regions, depending on the number of persons involved in the operation of the apparatus. If bilateral communication between two persons present near or in the apparatus is desired, a first region 39 may coincide with a second region 41. A person present in such a combined region can then speak to a person outside this combined region as well as hear what is said by a person outside this region.

In the first region 39 there is arranged a microphone 43 which is capable of picking up sound information 45 for example, (words spoken by a person 47) as well as gradient noise 49. The output signal of the microphone 43, being a reproduction of this mixture of sounds, is applied to a signal delay device 53 via an amplifier 51. These means may be an analog signal delay device, for example an analog delay line, but also a digital delay device, for example a shift register. In the latter case an analog-to-digital converter (not shown) must be inserted between the amplifier 51 and the digital device delay. If desired, the signal delay device 53 may also be formed by a suitably programmed microprocessor.

The communication system also comprises a generator 55 for generating a reference signal which is dependent on the gradient noise. These means may be connected directly to one or more outputs of the gradient signal generator 9 which are specially provided for this purpose as shown in FIG. 2. They may also be connected, for example to the outputs of the gradient amplifiers 11 or to another part of the power supply source 7. It is alternatively possible to arrange a second microphone 57 in the vicinity of the gradient coils 3 in such a manner that it picks up almost exclusively the gradient noise. The second microphone 57 can then be connected, via a lead 59 (denoted by a dashed line), to an input of the reference signal generator 55. If desired, the generator 55 may comprise elements for signal processing (for example, amplifiers and filters) or may possibly constitute simply a connection, without signal influencing, between the input and the output. The reference signal available on the output of the generator 55 is a reproduction of the gradient noise in the vicinity of the gradient coils 3. To the output of the means 55 there is connected a filter device 61 whose transfer function is a model of the path travelled by the gradient noise from the gradient coils 3 to the microphone 43. The filter device thus converts the reference signal into a signal which corresponds substantially to the gradient noise at the area of the microphone 43. Filter devices of this kind are described, for example in U.S. Pat. No. 5,033,082 and the previous, non-published European Patent Application bearing Docket No. PHN 14.250 in the name of Applicant of which U.S. patent application Ser. No. 08/150,655 is a counterpart. The filter device 61 may be of an analog or digital type. In the latter case the means 55 will also include an analog-to-digital converter. If desired, the reference signal generator 55 and the filter device 61 can be combined so as to form a common device whose transfer function is a combination of the transfer functions of the generator 55 and the filter device 61.

The output signal of the filter device 61 is applied to the negative input of a summing device 63 whereas the output signal of the delay device 53 is applied to the positive input of the summing device. The delay introduced by the delay device 53 is chosen so that a signal caused by gradient noise and flowing via the microphone 43 reaches the summing device 63 at exactly the same instant as a corresponding signal which flows via the filter device 61. As a result, the output signal of the filter device 61, being a substantially exact reproduction of the gradient noise 49 at the area of the microphone 43, is added in phase opposition to the delayed output signal of the microphone, being a reproduction of the mixture of gradient noise 49 and sound information 45. As a result, the output signal of the summing device 63 is a reproduction of the pure sound information 45 without gradient noise 49. This output signal is applied to a distribution amplifier 65 which comprises a number of outputs whereto sound reproduction devices are connected. The distribution amplifier 65 constitutes a sound reproduction device in conjunction with the sound reproduction means. The sound reproduction means may be constructed in various ways. FIG. 2 shows some relevant examples. A first example is formed by a loudspeaker 67 which is arranged in a room 71 which is surrounded by sound-absorbing walls 69 and which is situated in the second region 41. In the space 71 there may also be arranged, for example a console (not shown) for controlling the magnetic resonance imaging apparatus. A second example of a sound reproduction means is formed by a headset 73 with a pair of earphones 75 embedded in a sound-absorbing material. A headset of this kind may also be worn outside the space 71, so that the second region 41 may be situated everywhere in the vicinity of the magnetic resonance apparatus. If desired, the headset 73 may be a wireless type, for example a type which receives a signal via a transmitter operating with infrared radiation. A third example of a sound reproduction means is particularly suitable for the reproduction of sound in a second region 41 which is situated fully or partly within the measuring space 35. This example of a sound reproduction means comprises an electro-acoustic transducer 77 which is situated outside the measuring space 35 and which is acoustically connected, via an air-filled tubular connection member 79, for example a plastics tube as described in JP-A-1-145 051, to sound reproduction members 81 which are surrounded by a sound-absorbing material and which form part of a head section 83 which can be arranged as a headset on the head of a patient present in the measuring space 35. Because all sound reproduction means described are surrounded by a noise-absorbing material, sounds from the environment, for example gradient noise and, for example noise produced by the cooling device 31, hardly have an effect on the audibility of the information reproduced by the sound reproduction device.

As has already been stated, the output signal of the summing device 63 is in principle an exact reproduction of the pure sound information 45 without gradient noise 49. In practice, however, it may occur that this output signal still contains a small component which originates from gradient noise. This may be the case, for example when the acoustic properties of the first region 39 and/or the second region 41 change because, for example personnel moves around in these regions or apparatus is displaced therein. In order to remove these last remnants of gradient noise from the signal to be applied to the sound-reproducing means it may be desirable to determine whether the output signal of, for example the summing device 63 or the distribution amplifier 65 contains a signal originating from gradient noise. To this end, this output signal can be applied, for example to a correlation device (not shown) which is known per se and which correlates the output signal of, for example the summing device 63 with, for example the reference signal. The correlation device produces an output signal which is a measure of the gradient noise component in the output signal of the summing device 63. From the output signal of the correlation device there can be derived a correction signal which corrects, for example the delay time of the signal delay means 53. The correction signal can also influence the transfer function of the means 55 and/or the filter device 61. The delay time of the signal delay means 53 may also be permanently adjusted to a value which is too high in substantially all cases. The correction signal can then control a delay, for example caused by the means 55 or the filter device 61, in such a manner that ultimately the output signals of the filter device 61 and the signal delay means 53 exhibit exactly the correct phase and amplitude relationship for the removal of any gradient noise contribution from the output signal of the summing device 63.

I claim:

1. A magnetic resonance imaging apparatus, comprising a magnet system for generating a steady magnetic field in a measuring space, a gradient coil system for generating gradient fields in the measuring space, a power supply source for the gradient coils, and a communication system for transferring voice sound information from a first region in which the level of gradient noise generated by the gradient coils is comparatively high to a separate second region, which communication system comprises means for generating a reference signal which is dependent on the gradient noise, a microphone which is arranged in the first region so as to pick up a mixture of voice sound information desired to be communicated to the second region and gradient noise, a sound reproduction device, at least a part of which is situated in the second region, and a noise suppression device which comprises a filter device for modeling the acoustic path from the gradient coils to the microphone for converting the reference signal into a signal which corresponds substantially to the gradient noise at the area of the microphone, and a summing device for adding the output signal of the filter device to the output signal of the microphone in phase opposition, the output of the summing device being connected to the sound reproduction device to reproduce the voice sound information, characterized in that between the microphone and the summing device there is provided signal delay means for delaying the microphone signal for a predetermined period of time, and that the sound reproduction device comprises a sound reproduction member surrounded by sound-absorbing material for attenuating ambient sounds in the second region more than sounds which originate from the sound reproduction member.

2. A magnetic resonance imaging apparatus as claimed in claim 1, characterized in that the sound reproduction device comprises a headset with a pair of earphones which are embedded in said sound-absorbing material.

3. A magnetic resonance imaging apparatus as claimed in claim 1, in which at least a portion of the second region is within the measuring space, characterized in that the sound reproduction device comprises an electro-acoustic transducer which is arranged outside the measuring space and which is acoustically connected, via at least an air-filled tubular connecting member, to said sound reproduction member which is enclosed by said sound-absorbing material and forms part of a head section which can be arranged on the head of a patient in the measuring space.

4. A magnetic resonance imaging apparatus as claimed in claim 1, characterized in that the means for generating the reference signal are arranged to receive on their input a signal which corresponds to the output signal of the power supply source for the gradient coils.

5. A magnetic resonance imaging apparatus as claimed in claim 1, characterized in that the means for generating the reference signal comprise a second microphone which is arranged so that it can pick up the gradient noise.

6. A magnetic resonance imaging apparatus as claimed in claim 2, characterized in that the means for generating the reference signal are arranged to receive on their input a signal which corresponds to the output signal of the power supply source for the gradient coils.

7. A magnetic resonance imaging apparatus as claimed in claim 3, characterized in that the means for generating the reference signal are arranged to receive on their input a signal which corresponds to the output signal of the power supply source for the gradient coils.

8. A magnetic resonance imaging apparatus as claimed in claim 2, characterized in that the means for generating the reference signal comprise a second microphone which is arranged so that it can pick up the gradient noise.

9. A magnetic resonance imaging apparatus as claimed in claim 3, characterized in that the means for generating the reference signal comprise a second microphone which is arranged so that it can pick up the gradient noise.

10. A magnetic resonance imaging apparatus as claimed in claim 4, characterized in that the means for generating the reference signal comprise a second microphone which is arranged so that it can pick up the gradient noise.

* * * * *